United States Patent [19]

Ito

[11] Patent Number: 5,084,618
[45] Date of Patent: Jan. 28, 1992

[54] AUTOFOCUS METHOD AND APPARATUS FOR ELECTRON MICROSCOPE

[75] Inventor: Takashi Ito, Tokyo, Japan

[73] Assignee: Jeol Ltd., Tokyo, Japan

[21] Appl. No.: 609,871

[22] Filed: Nov. 6, 1990

[30] Foreign Application Priority Data

Nov. 8, 1989 [JP] Japan .................................. 1-290819

[51] Int. Cl.[5] ........................................... H01J 37/26
[52] U.S. Cl. ..................................... 250/307; 250/311; 250/397
[58] Field of Search ......................... 250/307, 311, 397

[56] References Cited

U.S. PATENT DOCUMENTS

| | | | |
|---|---|---|---|
| 3,835,403 | 9/1974 | Leirnemann | 250/311 |
| 4,618,766 | 10/1986 | van der Most et al. | 250/307 |
| 4,680,469 | 7/1987 | Nomura et al. | 250/311 |
| 4,698,503 | 10/1987 | Nomura et al. | 250/311 |
| 4,978,856 | 12/1990 | Akado | 250/310 |

Primary Examiner—Bruce C. Anderson
Attorney, Agent, or Firm—Webb, Burden, Ziesenheim & Webb

[57] ABSTRACT

Autofocus method and apparatus capable of quickly detecting the focal point in an electron microscope in spite of the magnetic aftereffects of the ferromagnetic substance forming the objective lens. The autofocus method is initiated by causing the electron beam emitted from the microscope to hit a specimen at a first angle. Under this condition, the excitation current fed to the objective lens is continuously varied between values. At the same time, a video signal obtained from the resulting projected image is sampled at fixed intervals to obtain a first set of data. Then, the beam is caused to hit the specimen at a second angle. Under this condition, the excitation current fed to the objective lens is continuously varied between values. Simultaneously, a video signal produced from the resulting projected image is sampled at fixed intervals to obtain a second set of data. These two sets of data are compared to find the focal point.

6 Claims, 4 Drawing Sheets

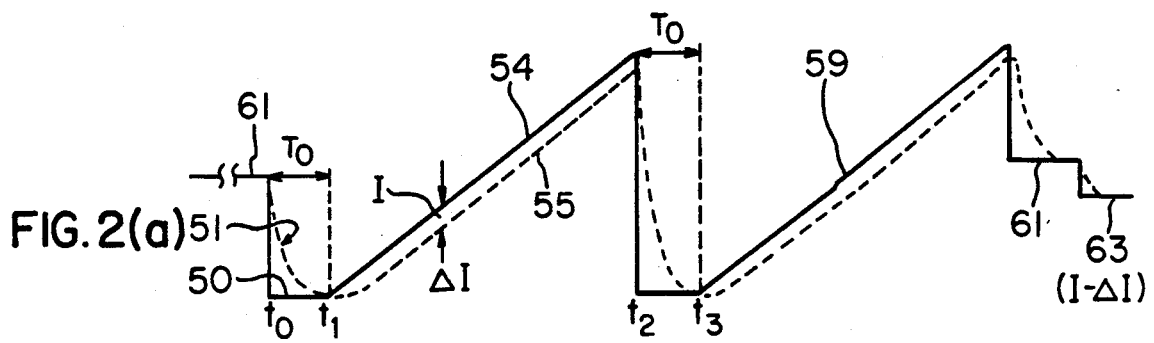
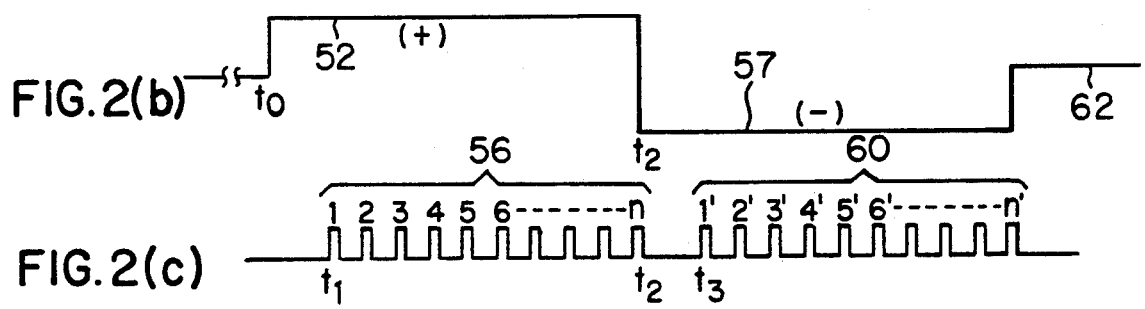
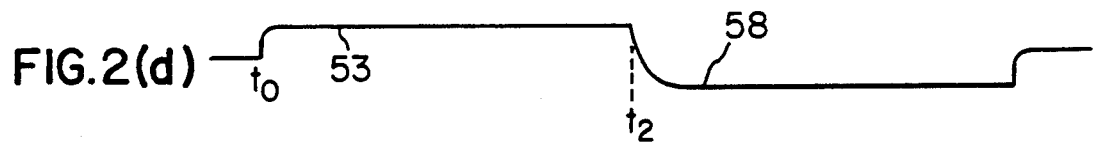
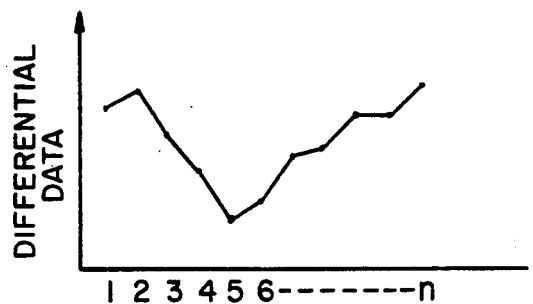
FIG. 3

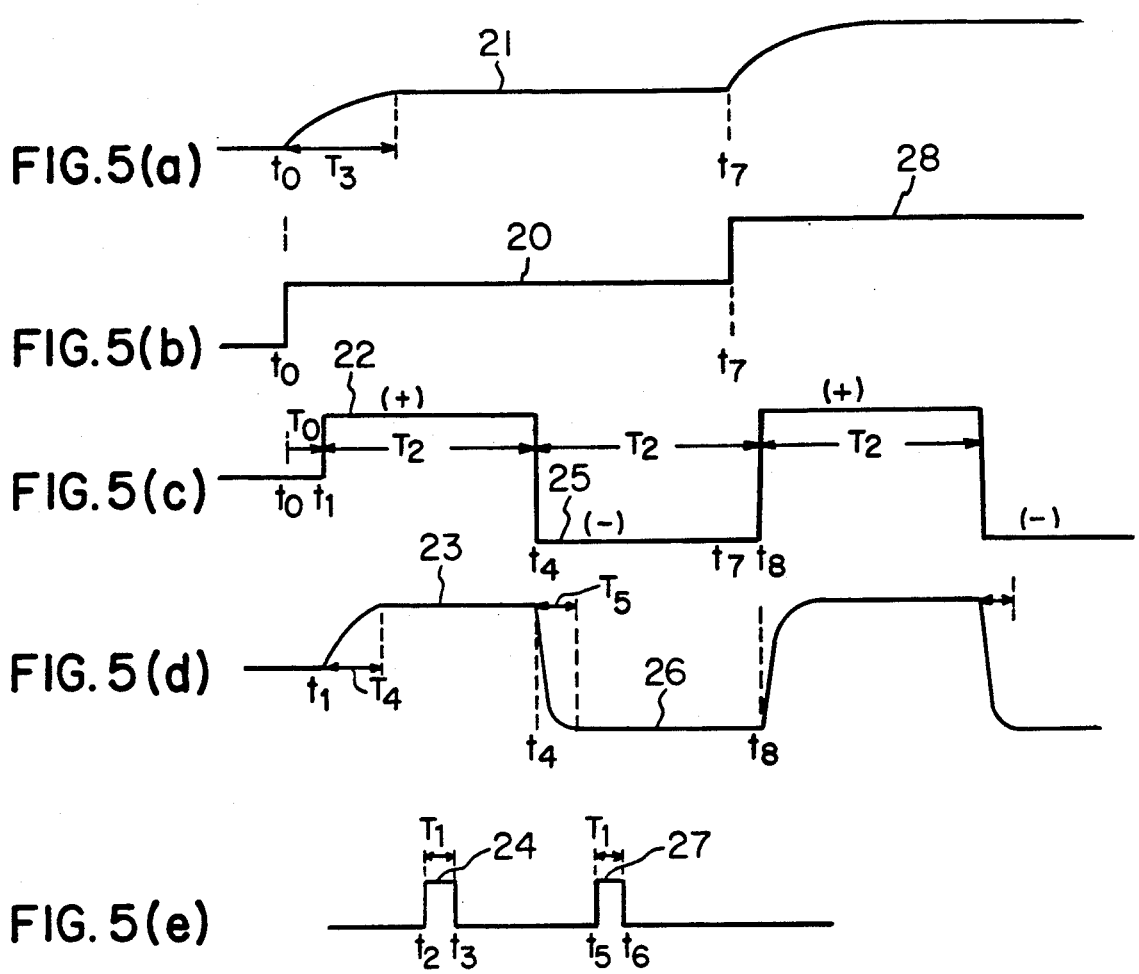
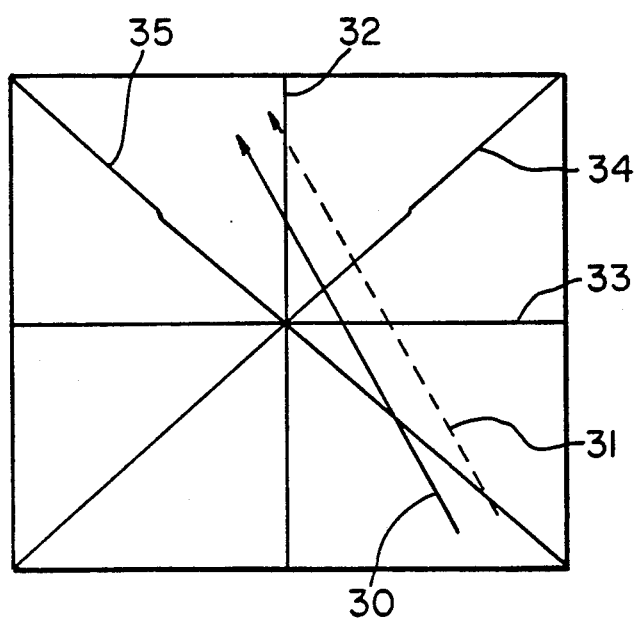
FIG. 6

AUTOFOCUS METHOD AND APPARATUS FOR ELECTRON MICROSCOPE

FIELD OF THE INVENTION

The present invention relates to method and apparatus for automatically focusing an electron microscope.

BACKGROUND OF THE INVENTION

An apparatus which illuminates a specimen placed in a transmission electron microscope with the electron beam to observe the shape or structure of the specimen uses an autofocus apparatus that creates a clear projection image of the specimen on a screen from the transmitted electron beam. Various methods have been proposed to focus the electron beam. One of them is disclosed in U.S. Pat. No. 4,680,469 and has been obtained by expanding the image wobbler method in which the excitation current fed to the objective lens is varied while causing the inclined electron beam to hit one point on a specimen surface from two different directions alternately. When the image created at this one point on the screen is not blurred, it follows that the point is the focal point. The prior art autofocus method utilizing the image wobbler method is next described in greater detail.

Referring to FIG. 4, there is shown the prior art autofocus apparatus utilizing the image wobbler method. FIG. 5 shows waveforms produced at various locations in the apparatus shown in FIG. 4, for illustrating the operation. FIG. 6 is a diagram illustrating how the focal point is found. The autofocus apparatus comprises deflection coils 1 for deflecting the electron beam, an objective lens 3, an imaging lens 4, a screen 5, a control unit 11, a driver circuit 12 for exciting the deflection coils 1, a D/A converter circuit 13, a current stabilizer circuit 14, a memory 15, a synchronizing signal-generating circuit 16, and a TV camera 17. A specimen is indicated by 2.

In the operation of the system shown in FIG. 4, the electron beam hits a point P on the specimen 2. The beam is inclined at an angle $\theta$ from the optical axis 0 by the deflection coils 1 as indicated by the solid line 6 or the broken line 7. The solid line 6 and the broken line 7 are symmetrical with respect to the optical axis 0. When the electron beam is inclined as indicated by the solid line 6 or the broken line 7, the beam is referred to herein as being inclined forwardly (+) or rearwardly (−), respectively. The specimen 2 is placed between the pole pieces (not shown) of the objective lens 3. The imaging lens 4 which is shown in the form of a block consists of three or four stages of intermediate and projector lenses. The combination of the excitation currents fed to the lenses from a lens power supply 19 is variably set by a magnification-setting circuit 18. A transmission electron micrograph of the specimen 2 is focused onto the screen 5 consisting of a fluorescent screen at a desired magnification. The solid line 8 indicates a magnified image when the electron beam is inclined forwardly (+). The broken line 9 indicates a magnified image when the beam is inclined rearwardly (−).

The control unit 11 consists of a microprocessor or the like and performs processing for automatically focusing the electron beam. In particular, the control unit 11 instructs the deflection coil driver circuit 12 to incline the beam forwardly (+) or rearwardly (−). The control unit 11 causes the D/A converter circuit 13 to produce an excitation current to the objective lens 3 via the current stabilizer circuit 14. The control unit 11 orders the TV camera 17 to pick up the projection image, and performs arithmetic operations to find the focal point from the obtained projection image.

The driver circuit 12 is instructed to produce a given excitation current by the control unit 11, for inclining the electron beam forwardly (+) or rearwardly (−), the current being fed to the deflection coils 1. The D/A converter circuit 13 converts the digital excitation current sent from the control unit 11 into analog form and supplies the analog excitation current to the current stabilizer circuit 14. Then, the stabilizer circuit 14 creates the excitation current specified by the control unit 11 and supplies the current to the objective lens 3.

The memory 15 comprises a backing store, a RAM, and a ROM. The backing store hold files made up of data about the projection image picked up by the TV camera 17. The RAM acts as the work area in which processed data is held. Various kinds of data necessary for performing a series of autofocus operations are stored in the ROM. The synchronizing signal-generating circuit 16 produces a synchronizing signal supplied to the TV camera 17, as well as clock pulses necessary for the operation of the control unit 11. The camera 17 picks up the image of the specimen 2 projected on the screen 5 from the rear side of the screen under instructions from the control unit 11. The data about the image picked up constitutes the files held on the backing store of the memory 15.

When an appropriate operation means such as an autofocus start switch (not shown) is operated to start a series of autofocus operations, the control unit 11 produces a digital signal of a level indicated by 20 in FIG. 5(b) at an instant $t_0$ to supply a first given excitation current to the objective lens 3. The digital signal is converted into analog form by the D/A converter circuit 13, and then the current stabilizer circuit 14 furnishes an electrical current corresponding to the level 20 (FIG. 5(b)). As a result, the magnetic field set up by the objective lens 3 varies as indicated by 21 in FIG. 5(a). After a lapse of a given time $T_0$ from the instant $t_0$, or at an instant $t_1$, the control unit 1 sends a control signal 22 (FIG. 5(c)) to the driver circuit 12, which then produces an excitation current to the deflection coils 1 to incline the electron beam forwardly (+), for example, according to the control signal 22. Thus, the beam is inclined at an angle of $\theta$ by the magnetic field 23 (FIG. 5(d)) produced by the deflection coils 1. After the magnetic fields generated by the objective lens 3 and the coils 1 have stabilized and the tilt of the beam has stabilized, the control unit 11 sends a control signal 24 (FIG. 5(e)) to the TV camera 17 to pick up the projection image on the screen 5 during the given period $T_1$ from an instant $t_2$ to an instant $t_3$. The collected data is stored in the memory 15. When the collection of data about the image created by the forwardly inclined beam is completed, the control unit supplies a control signal 25 (FIG. 5(c)) to the driver circuit 12 at an instant $t_4$, so that the beam is inclined rearwardly (−) by the magnetic field 26 (FIG. 5(d)) produced by the deflecting coils 1. After the magnetic field generated by the coils and the tilt of the beam have stabilized, the control unit 11 produces a control signal 27 (FIG. 5(e)) to the TV camera 17 to pick up the projection image on the screen 5 during the given period $T_1$ from an instant $t_5$ to an instant $t_6$. The collected data about the image is stored in the memory 15. When the collection of data about the image created by the rearwardly (−) inclined beam is complete, the control unit 11 calculates the difference between the accepted two images and data about the difference is stored in the memory 15.

The two images can be two-dimensional images. The difference between data on a one-dimensional line may be calculated. Also, the differences between data on unparallel lines may be calculated. It is now assumed that the beam is inclined forwardly (+) by the objective lens 3 excited with a certain current and an image 30 (FIG. 6) is picked up, and that the beam is inclined rearwardly (−) by the objective lens 3 and an image 31 (FIG. 6) is picked up. In this case, the difference between the data on any of unparallel lines 32, 33, 34, and 35 may be calculated. Also, the differences between the data on all the lines 32-35 may be obtained and combined to find the difference between the images picked up when the beam is inclined forwardly (+) and rearwardly (−), respectively.

After the processing at one excitation current level to the objective lens 3 is completed in this way, the control unit 11 delivers a digital signal of a level 28 (FIG. 5(b)) at an instant $t_7$ to supply a second given excitation current to the objective lens 3. Subsequently, the same processing as the foregoing is conducted. In particular, the electron beam in inclined forwardly (+), and data about the image is collected. Then, the beam is inclined rearwardly (−), and data about the image is collected. In this way, the control unit 11 accepts data about the images created by the electron beam inclined forwardly (+) and rearwardly (−), respectively, while changing the excitation current fed to the objective lens 3 in a stepwise fashion within a given range. The difference between the obtained two images is calculated for each value of the excitation current. After the completion of the collection of the data about the images, a point is found at which the difference between the images is minimal. This point is taken as the focal point. The excitation current under this condition is supplied to the objective lens 3. Consequently, a projection image is focused onto the screen 5.

Unfortunately, when the prior art image wobbler method is used, it takes a long time to find the focal point. More specifically, the objective lens 3 contains a yoke and pole pieces made of a ferromagnetic substance that shows magnetic aftereffects. Therefore, when the objective lens is instructed to produce the excitation current 20 (FIG. 5(b)) by the control unit 11, the lens cannot immediately respond. The magnetic field does not stabilize until a period $T_3$ (FIG. 5(a)) passes. Although the period $T_3$ differs according to the kind of magnetic substance, the period is about 0.5 to 1.0 second for the magnetic substance usually used in the objective lens.

The same phenomenon occurs for the deflecting coils 1. Because of the magnetic aftereffects of the ferromagnetic substance forming the deflecting coils 1, it takes long for the magnetic field inclining the electron beam to stabilize. When the amount of the electrical current is increased, a period of $T_4$ (FIG. 5(d)) is required. When the amount of the electrical current is reduced, a period of $T_5$ is required. For the normally used deflection coils, the periods $T_4$ and $T_5$ are about 0.1 to 0.2 second.

In order to obtain accurate image data, the data must be collected when the magnetic fields produced by the objective lens 3 and the deflection coils 1 are both stabilized. For this reason, when a first set of image data 24 (FIG. 5(e)) is collected, the time interval between the instants $t_2$ and $t_0$ must be at least 0.5 second. When a second set of image data is collected, the interval between instants $t_5$ and $t_4$ must be at least 0.2 second.

In this way, the autofocus apparatus utilizing the prior art image wobbler method is required to wait long until image data is allowed to be collected whenever the excitation current fed to the objective lens 3 is varied. Accordingly, where it is necessary to switch the excitation current fed to the objective lens 3 between numerous close levels as encountered in the case of autofocus action at high magnifications, a long time is taken to detect the focal point. Hence, the prior art apparatus has not been practical.

SUMMARY OF THE INVENTION

In view of the foregoing problems, it is an object of the present invention to provide autofocus method and apparatus used in an electron microscope, for detecting the focal point quickly.

An autofocus method used in electron microscopy in accordance with applicant's invention comprises the steps of: varying the excitation current fed to the objective lens of an electron microscope between different values while causing the electron beam emitted from the microscope to hit a specimen at a first angle; sampling the resulting video signal representing a projected image at predetermined intervals and storing the obtained samples in a memory to obtain a first set of data; then varying the excitation current fed to the objective lens between different values while causing the electron beam to hit the specimen at a second angle; sampling the resulting video signal representing a projected image at predetermined intervals and storing the obtained samples in the memory to obtain a second set of data; and comparing the first set of data with the second set of data to find the focal point.

One embodiment of the autofocus method comprises the steps of: switching the excitation current fed to the objective lens of an electron microscope coarsely between plural different values while causing the electron beam emitted from the microscope to hit a specimen at a first angle; sampling the resulting video signal representing a projected image at predetermined intervals and storing the obtained samples in a memory to obtain a first set of data; then switching the excitation current fed to the objective lens coarsely between plural different values while causing the electron beam to hit the specimen at a second angle; sampling the resulting video signal representing a projected image at the predetermined intervals and storing the obtained samples in the memory to obtain a second set of data; comparing the first set of data with the second set of data to roughly find the focal point; subsequently switching the excitation current fed to the objective lens finely between plural different values within such a range that the excitation current takes only estimated vicinities of the roughly found focal point while causing the beam to hit the specimen at the first angle; sampling the resulting video signal representing a projected image at predetermined intervals and storing the obtained samples in the memory to obtain a third set of data; switching the excitation current fed to the objective lens finely between said plural different values while causing the electron beam to hit the specimen at the second angle; sampling the resulting video signal representing a projected image at the predetermined intervals and storing the obtained samples in the memory to obtain a fourth set of data; and comparing the third set of data with the fourth set of data to find the focal point.

An autofocus apparatus according to the present invention comprises: a deflection system capable of varying the angle at which the electron beam emitted from an electron microscope hits a specimen without moving the irradiated point on the specimen; a deflection control means which controls the deflection system so that the electron beam may hit the irradiated point at a first angle and then at a second angle; an objective lens control means which brings about a first change and a second change in the excitation current fed to the objective lens of the microscope when the beam hits the specimen at the first angle and at the second angle, respectively; an image pickup means converting the image of the specimen taken by the microscope into a video signal; a control means which samples the video signal from the image pickup means at fixed intervals and stores the obtained samples in a memory during the periods in which the first and second changes are respectively brought about, to obtain first and second sets of data; and a means which compares the corresponding data items of the first and second sets of data to find the excitation current value that causes the objective lens to focus the electron beam.

In the prior art techniques, the excitation current fed to the objective lens is changed in a stepwise fashion. Whenever the excitation current is switched to another value, images are obtained, corresponding to forward (+) tilt and rearward (−) tilt of the electron beam. On the other hand, in the present invention, after the beam has been inclined forwardly (+) or rearwardly (−), the excitation current fed to the objective lens 3 is changed linearly continuously. During this process, image data is obtained. Then, the beam is inclined rearwardly (−) or forwardly (+). Under this condition, the excitation current fed to the objective lens 3 is varied most preferredly linearly continuously and, at the same time, image data is derived. Consequently, the time taken for the magnetic fields developed by the objective lens and the deflection coils, respectively, to stabilize can be shortened greatly. This permits the focal point to be detected in a short time. Since the accuracy with which the focal point is detected can be easily modified by altering the excitation current intervals at which the current fed to the objective lens is swept stepwise, the focal point can be detected in a short time even at high magnifications that need large amounts of data.

BRIEF DESCRIPTION OF THE DRAWINGS

FIGS. 2(a)-(d) are timing diagrams of waveforms produced at various locations in the apparatus shown in FIG. 1, for illustrating a series of autofocus operations;

FIG. 3 is a graph illustrating the manner in which the focal point is determined;

FIGS. 5(a)-(d) are timing diagrams illustrating the operations of the apparatus shown in FIG. 4; and FIG. 6 is a diagram illustrating the manner in which the focal point is found by the apparatus shown in FIG. 4.

DETAILED DESCRIPTION OF THE INVENTION

Figure 1:
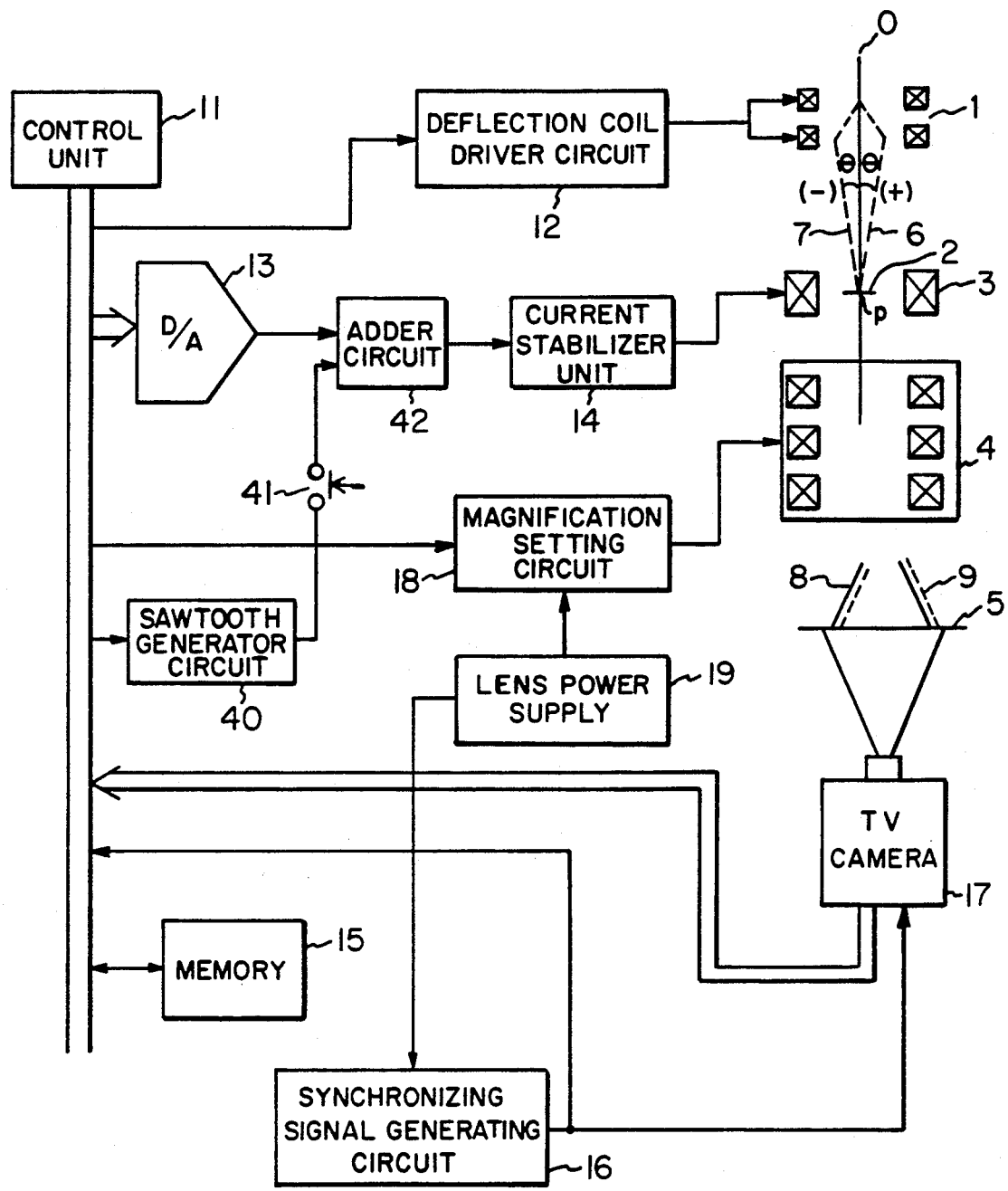
FIG. 1 is a block diagram of an autofocus apparatus according to the applicant's invention being used with an electron microscope.
Figure 4:
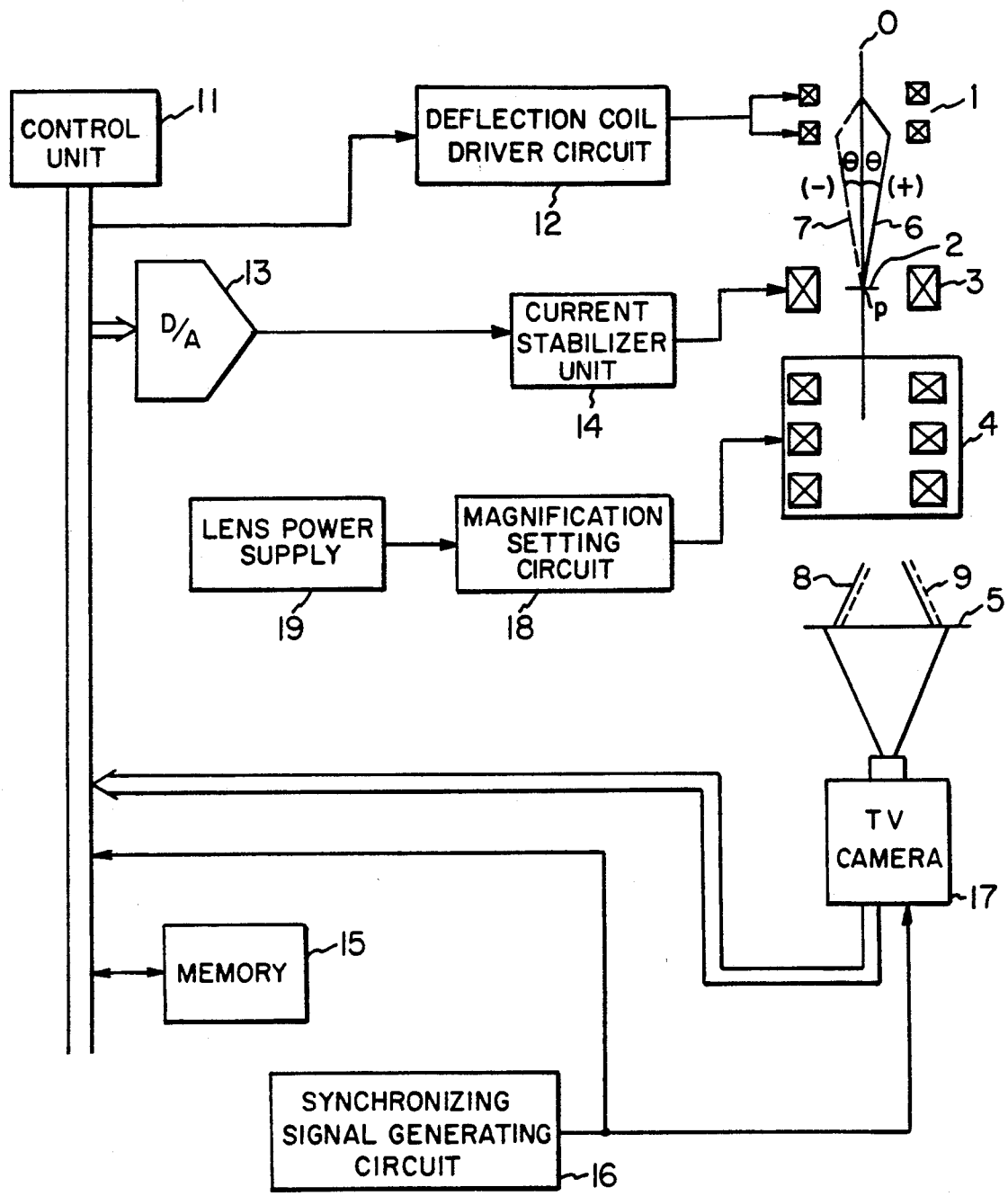
FIG. 4 is a block diagram of a prior art autofocus apparatus utilizing the prior art image wobbler method.

Referring to FIG. 1, there is shown an autofocus apparatus for use with an electron microscope, the apparatus being fabricated in accordance with the present invention. It is to be noted that like components are indicated by like reference numerals in various figures. The apparatus shown in FIG. 1 is similar in structure to the apparatus shown in FIG. 4 except that a sawtooth generator 40 and adder circuit 42 are added, but the processing performed by the control unit 11 is entirely different as described below.

When an appropriate operation means such as an autofocus start switch (not shown) is operated to start a series of autofocus operations, the control unit 11 produces a digital signal of a level 50 (FIG. 2(a)) to the D/A converter circuit 13 at instant $t_0$. The level 50 corresponds to the minimum one of those values of the excitation current fed to the objective lens 3 which bring the irradiated point within an area that is searched for the focal point. Therefore, the magnetic field set up by the objective lens 3 is varied as indicated by broken line 51 in FIG. 2(a) by the magnetic aftereffects (delay) of the magnetic substance forming the lens. The control unit 11 produces a control signal 52 (FIG. 2(b)) to the deflection coil driver circuit 12 at the same instant $t_0$. The magnetic field developed by the deflection coils 1 then changes as indicated by 53 in FIG. 2(b) to incline the electron beam forwardly (+).

Then, the control unit 11 closes a switch 41 to connect the sawtooth generator circuit 40 with the adder circuit 42 after a lapse of a period $T_0$ from the instant $t_0$, or at an instant $t_1$. The control unit 11 orders the sawtooth generator circuit 40 to produce an electrical current of a sawtooth waveform. This current is fed via the switch 41 to the adder circuit 42 and added to the output from the A/D converter circuit 13. The result is that the excitation current supplied to the objective lens 3 varies linearly continuously as indicated by 54 in FIG. 2(a). The period $T_0$ is set slightly longer than the time taken for the magnetic field developed by the objective lens 3 to stabilize because of the aftereffects. Although it takes some time for the magnetic field generated by the deflection coils 1 to stabilize, the field produced by the coils 1 stabilizes faster than the field produced by the objective lens 3 and so it is clear that the field developed by the coils 1 stabilizes before the instant $t_1$.

The excitation current 54 fed to the objective lens 3 is swept until the instant $t_2$ over the range of currents which bring the irradiated point within the area that is searched for the focal point. At this time, the magnetic field set up by the objective lens 3 varies as indicated by the broken line 55 in FIG. 2(a) by the magnetic aftereffects.

The control unit 11 changes the excitation current fed to the objective lens 3 linearly continuously and produces control signals 56 (FIG. 2(c)) to the TV camera 17 at the instant $t_1$ to cause the camera to pick up the image. The camera 17 samples the projection image at fixed intervals of time until n samples are taken. The collected data is stored in the memory 15 at given addresses.

In this way, the excitation current fed to the objective lens 3 is continuously linearly swept over the predetermined range while inclining the electron beam forwardly (+). After the collection of a given number of data items is completed, the control unit 11 returns the excitation current fed to the lens 3 to the minimum value within the swept range at the instant $t_2$ and delivers a control signal 57 (FIG. 2(b)) to the driver circuit 12. This modifies the magnetic field developed by the deflection coils 1 to tilt the electron beam rearwardly (−) as indicated by 58 in FIG. 2(d). Then, the excitation current to the lens 3 is changed linearly continuously as indicated by 59 in FIG. 2(a) in the same way as in the above process, and n image data items 60 (FIG. 2(c)) are collected.

After a set of image data is collected while tilting the electron beam forwardly (+) and a second set of image data is collected while tilting the beam rearwardly (−), the control unit 11 instructs the D/A converter circuit 13 to produce the excitation current 61 (FIG. 2(a)) which was set immediately before the start of the autofocus processing. The control unit 11 delivers a control signal 62 (FIG. 2(b)) to the driver circuit 12 to return the beam to the optical axis 0. The control unit 11 opens the switch 41 to disconnect the sawtooth generator circuit 40 from the adder circuit 42. Further, the control unit conducts processing for determining the focal point as described below.

The image created when the electron beam is inclined forwardly (+) was sampled at fixed intervals. The image created when the beam is inclined rearwardly (−) was sampled at the same fixed intervals. The difference between these two sets of data is found. Then, the point at which the difference is minimal is found. In this way, the focal point is found. Specifically, as shown in FIG. 2(c), it is assumed that n image data items are collected in each of the cases where the beam is inclined forwardly and rearwardly, respectively. The control unit calculates the difference between data items 56-1 and 60-1'. The difference is stored in the memory 15. This series of operations is repeated n times to obtain n differential data items. If these differential data items have magnitudes as shown in FIG. 3, then the fifth differential data item is minimal. Therefore, the excitation current I (FIG. 2(a)) which produces the data item 56-5 (FIG. 2(c)) can be regarded as focusing the electron beam. Various methods of finding differential data are known. Any of the known methods can be adopted.

The control unit 11 recognizes that the excitation current is I, but the response of the field produced by the objective lens 3 is delayed by the magnetic aftereffects. Therefore, the magnetic field actually produced by the objective lens 3 is a magnetic field developed with an electrical current that is smaller than the current I by $\Delta I$. For this reason, the actual focal point corresponds to $I - \Delta I$, thus necessitating correction.

One example of this correction is made as follows. The value of the current deviation $\Delta I$ caused by the magnetic aftereffects of the objective lens of this electron microscope was measured and has been previously stored in the ROM of the memory 15. The control unit 11 calculates the difference between the excitation current value I found by the above-described processing and the value of the current deviation $\Delta I$ stored in the memory 15. The focal point can be determined from the difference. Then, the control unit 11 causes the D/A converter circuit 13 to produce an excitation current of level 63 (FIG. 2(a)) corresponding to the determined focal point. Consequently, a projection image can be focused onto the screen 5.

The number of samples n taken is an arbitrary number. The number n can be changed according to the magnification. At high magnifications, the image is affected more by defocusing, and higher focusing accuracy is needed. This requires that a larger number of samples be taken. However, at low magnifications, the image is affected less, and lower focusing accuracy is necessary. Hence, less samples are required to be taken. The sampling pulses produced by the synchronizing signal-generating circuit 16 for sampling a video signal is controlled according to the value of the magnification set into the magnification-setting circuit 19 to increase or decrease the number of samples n, depending on the magnification. This makes it possible to detect the focal point in a short time.

In the above example, collection of image data is started just when the excitation current fed to the objective lens 3 is varied. Of course, the collection of data can be initiated after the magnetic field developed by the deflection coils 1 has stabilized. Also in the above example, only one series of autofocus operations is performed. In a modified example, a video signal obtained from an image may be sampled at intervals of time while sweeping the current fed to the objective lens coarsely (at large intervals of the excitation current) to find the focal point roughly. Then, the video signal produced from estimated vicinities of the focal point is sampled at intervals while sweeping the current fed to the objective lens finely (at small intervals of excitation current) to find the focal point accurately.

While the invention has been particularly shown and described with respect to preferred embodiments thereof, it will be understood by those skilled in the art that the foregoing and other changes in form and details can be made therein without departing from the spirit and scope of the invention.

Having thus described my invention with the detail and particularity required by the Patent Laws, what is claimed and desired to be protected by Letters Patent is set forth in the following claims.

What is claimed is:

1. An autofocus method used in electron microscopy, comprising the steps of:
   varying the excitation current fed to the objective lens of an electron microscope between different values while causing the electron beam emitted from the microscope to hit a specimen continuously at a first angle;
   sampling the resulting video signal representing a projected image at predetermined intervals and storing the obtained samples in a memory to obtain a first set of data;
   then varying the excitation current fed to the objective lens between different values while causing the electron beam to continuously hit the specimen at a second angle;
   sampling the resulting video signal representing a projected image at predetermined intervals and storing the obtained samples in the memory to obtain a second set of data; and
   comparing the first set of data with the second set of data to find the focal point.

2. The autofocus method of claim 1, wherein the number of samples taken in each step of sampling is increased or decreased, depending on whether the magnification is increased or decreased, respectively.

3. An autofocus method used in electron microscopy, comprising the steps of:
   varying the excitation current fed to the objective lens of the electron microscope coarsely between different values while continuously causing the electron beam emitted from the microscope to hit a specimen at a first angle;

sampling the resulting video signal representing a projected image at predetermined intervals and storing the obtained samples in a memory to obtain a first set of data;

then varying the excitation current fed to the objective lens coarsely while causing the electron beam to continuously hit the specimen at a second angle;

sampling the resulting video signal representing a projected image at predetermined intervals and storing the obtained samples in the memory to obtain a second set of data;

comparing the first set of image data with the second set of image data to roughly find the focal point;

subsequently varying the excitation current fed to the objective lens finely between different values within such a range that the excitation current takes in the vicinity of the roughly found focal point while causing the beam to hit the specimen at the first angle;

sampling the resulting video signal representing a projected image at predetermined intervals and storing the obtained samples in the memory to obtain a third set of data;

varying the excitation current finely between said different values in the vicinity of the roughly found focal point while causing the electron beam to hit the specimen at the second angle;

sampling the resulting video signal representing a projected image at the predetermined intervals and storing the obtained samples in the memory to obtain a fourth set of data; and comparing the third set of data with the fourth set of data to find the focal point.

4. An autofocus apparatus for use with an electron microscope comprising:

a deflection system capable of varying the angle at which the electron beam emitted from the electron microscope hits a specimen without moving the irradiated point on the specimen;

a deflection control means which controls the deflection system so that the electron beam may hit the irradiated point at a first angle and then at a second angle;

an objective lens control means which brings about a first continuous change and a second continuous change in the excitation current fed to the objective lens of the microscope when the beam hits the specimen at the first angle and at the second angle, respectively;

an image pickup means converting the image of the specimen taken by the microscope into a video signal;

a control means which samples the video signal from the image pickup means at the predetermined intervals and stores the obtained samples in a memory during the periods in which the first and second changes are respectively brought about, to obtain first and second sets of data; and a means which compares the corresponding data items of the first and second sets of data to find the excitation current value that causes the objective lens to focus the electron beam.

5. The autofocus apparatus of claim 4, further including a means which automatically controls the intervals at which the video signal is sampled, according to a signal indicative of the magnification of the electron microscope.

6. The autofocus apparatus of claim 4, wherein said first change and said second change in the excitation current fed to the objective lens are linear changes and equal in amount.

* * * * *

UNITED STATES PATENT AND TRADEMARK OFFICE
CERTIFICATE OF CORRECTION

PATENT NO. : 5,084,618

DATED : January 28, 1992

INVENTOR(S) : Takashi Ito

It is certified that error appears in the above-identified patent and that said Letters Patent is hereby corrected as shown below:

On the title page, after [73] Assignee: "Joel Ltd." should read --JEOL Ltd.--

Column 2, line 43 "1" should read --11--

Column 6, line 38, "A/D" should read --D/A--

Signed and Sealed this

Twenty-first Day of September, 1993

Attest:

BRUCE LEHMAN

*Attesting Officer*  *Commissioner of Patents and Trademarks*